US009805942B2

(12) United States Patent
Kim et al.

(10) Patent No.: US 9,805,942 B2
(45) Date of Patent: *Oct. 31, 2017

(54) METHOD OF MODIFYING EPITAXIAL GROWTH SHAPE ON SOURCE DRAIN AREA OF TRANSISTOR

(71) Applicant: Applied Materials, Inc., Santa Clara, CA (US)

(72) Inventors: Yihwan Kim, San Jose, CA (US); Xuebin Li, Sunnyvale, CA (US); Abhishek Dube, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/384,051

(22) Filed: Dec. 19, 2016

(65) Prior Publication Data

US 2017/0098547 A1    Apr. 6, 2017

Related U.S. Application Data

(63) Continuation of application No. 14/799,387, filed on Jul. 14, 2015, now Pat. No. 9,530,661.

(60) Provisional application No. 62/033,700, filed on Aug. 6, 2014.

(51) Int. Cl.
*H01L 21/308* (2006.01)
*H01L 21/02* (2006.01)
*H01L 29/66* (2006.01)
*H01L 21/8234* (2006.01)

(52) U.S. Cl.
CPC ...... *H01L 21/3083* (2013.01); *H01L 21/0262* (2013.01); *H01L 21/02532* (2013.01); *H01L 21/02598* (2013.01); *H01L 21/02634* (2013.01); *H01L 21/02639* (2013.01); *H01L 21/823431* (2013.01); *H01L 29/66795* (2013.01)

(58) Field of Classification Search
CPC ........ H01L 21/02532; H01L 21/02598; H01L 21/02634; H01L 21/02639; H01L 21/3083; H01L 21/823431; H01L 27/0886; H01L 29/66795
See application file for complete search history.

(56) References Cited

U.S. PATENT DOCUMENTS

| 8,598,003 | B2 | 12/2013 | Murtthy et al. | |
|---|---|---|---|---|
| 9,530,661 | B2 * | 12/2016 | Kim et al. | .......... H01L 21/0262 |
| 2010/0224943 | A1 | 9/2010 | Kawasaki | |
| 2013/0049068 | A1 | 2/2013 | Lin et al. | |

(Continued)

OTHER PUBLICATIONS

PCT Notification of Transmittal of the International Search Report and the Written Opinion of the International earching Authority for International Application No. PCT/US2015/040425; dated Oct. 29, 2015; 11 total pages.

*Primary Examiner* — Stephen W Smoot
(74) *Attorney, Agent, or Firm* — Patterson + Sheridan LLP

(57) ABSTRACT

Methods for forming semiconductor devices, such as FinFETs, are provided. An epitaxial film is formed over a semiconductor fin, and the epitaxial film includes a top surface having two facets. A cap layer is deposited on the top surface, and portions of the epitaxial film in a lateral direction are removed. Having a smaller lateral dimension prevents the epitaxial film from merging with an adjacent epitaxial film and creates a gap between the epitaxial film and the adjacent epitaxial film.

20 Claims, 4 Drawing Sheets

(56) References Cited

U.S. PATENT DOCUMENTS

| | | |
|---|---|---|
| 2013/0089959 A1 | 4/2013 | Kwok et al. |
| 2013/0109152 A1 | 5/2013 | Huang et al. |
| 2013/0193446 A1 | 8/2013 | Chao et al. |
| 2014/0060627 A1 | 3/2014 | Haensch et al. |
| 2014/0065782 A1 | 3/2014 | Lu et al. |
| 2014/0134814 A1 | 5/2014 | Wong et al. |
| 2014/0175543 A1 | 6/2014 | Glass et al. |

\* cited by examiner

METHOD OF MODIFYING EPITAXIAL GROWTH SHAPE ON SOURCE DRAIN AREA OF TRANSISTOR

CROSS-REFERENCE TO RELATED APPLICATIONS

This application is a continuation application of co-pending U.S. patent application Ser. No. 14/799,387, filed on Jul. 14, 2015, now U.S. Pat. No. 9,530,661, issued on Dec. 27, 2016, which claims benefit of U.S. Provisional Pat. Application Ser. No. 62/033,700, filed on Aug. 6, 2014. Each of aforementioned applications are incorporated herein by reference.

BACKGROUND

Field

Embodiments described herein generally relate to methods for forming semiconductor devices, and more particularly to methods for forming fin field effector transistors (FinFETs).

Description of the Related Art

As circuit densities increase for next generation devices, the widths of interconnects, such as vias, trenches, contacts, gate structures and other features, as well as the dielectric materials therebetween, decrease to 22 nm or smaller dimensions, whereas the thickness of the dielectric layers remain substantially constant, with the result of increasing the aspect ratios of the features. Recently, complementary metal oxide semiconductor (CMOS) FinFET devices have been widely used in many logic and other applications and are integrated into various different types of semiconductor devices.

FinFET devices typically include semiconductor fins with high aspect ratios in which the channel and source/drain regions for the transistor are formed thereover. A gate electrode is then formed over and along side of a portion of the fin devices utilizing the advantage of the increased surface area of the channel and source/drain regions to produce faster, more reliable and better-controlled semiconductor transistor devices. Further advantages of FinFETs include reducing the short channel effect and providing higher current flow.

To improve transistor performance, stressor materials may fill source/drain areas, and the stressor materials may grow in source/drain areas by epitaxy. The epitaxial film is faceted by {111} planes and has a diamond shape along the transistor channel direction. In other words, the epitaxial film may extend laterally and form facets. With the scaling down of transistors, fin pitch (distance between adjacent fins) is getting smaller. This may cause the reduction in the distance between an epitaxial film grown on a fin and an epitaxial film grown on an adjacent fin, which may cause adjacent epitaxial films to merge. The merged epitaxial films decreases the effect of epitaxial films on the strain in the transistor channel, and defects may form easily at the junction of the merged area.

Therefore, there is a need for an improved method for forming FinFETs.

SUMMARY

Methods for forming semiconductor devices, such as FinFETs, are provided. An epitaxial film is formed over a semiconductor fin, and the epitaxial film includes a top surface having two facets. A cap layer is deposited on the top surface, and portions of the epitaxial film in a lateral direction are removed. Having a smaller lateral dimension prevents the epitaxial film from merging with an adjacent epitaxial film and creates a gap between the epitaxial film and the adjacent epitaxial film.

In one embodiment, a method for forming a semiconductor device is disclosed. The method includes forming an epitaxial film over a semiconductor fin, and the epitaxial film includes a top surface having a first facet and a second facet. The method further includes depositing a cap layer on the top surface, and removing portions of the epitaxial film in a lateral direction.

In another embodiment, a method for forming a semiconductor device is disclosed. The method includes disposing a substrate in a process chamber, and the substrate has a surface including one or more dielectric regions adjacent to one or more semiconductor regions. The method further includes concurrently forming an epitaxial film on each of the one or more semiconductor regions and an amorphous material on the one or more dielectric regions. The method further includes selectively removing the amorphous material formed on the one or more dielectric regions.

In another embodiment, a method for forming a semiconductor device is disclosed. The method includes forming an epitaxial film over a semiconductor fin, and the epitaxial film includes a first facet in contact with the semiconductor fin, a second facet in contact with the semiconductor fin, a third facet, and a fourth facet. The first and third facets form a first corner, the second and fourth facets form a second corner, and the third and fourth facets form a third corner. The method further includes depositing a cap layer on the third facet and the fourth facet, and removing portions of the epitaxial film in a lateral direction. The removing portions of the epitaxial film in the lateral direction includes removing the first and second corners and removing portions of the first, second, third and fourth facets.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Methods for forming semiconductor devices, such as FinFETs, are provided. An epitaxial film is formed over a semiconductor fin, and the epitaxial film includes a top surface having two facets. A cap layer is deposited on the top surface, and portions of the epitaxial film in a lateral direction are removed. Having a smaller lateral dimension prevents the epitaxial film from merging with an adjacent epitaxial film and creates a gap between the epitaxial film and the adjacent epitaxial film.

Figure 1A:
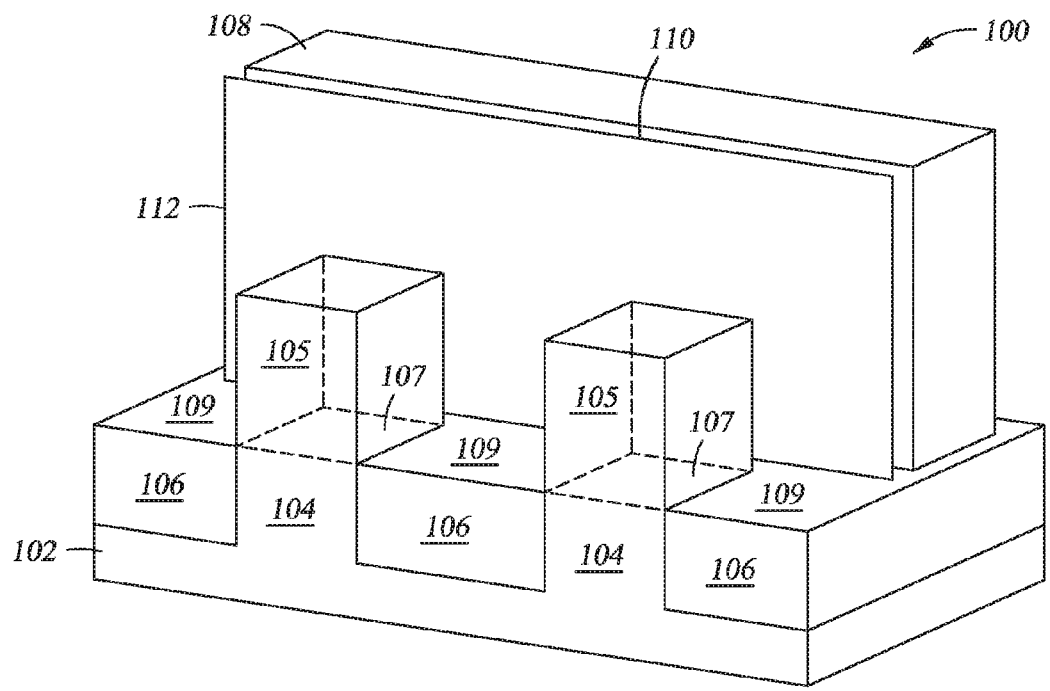
FIGS. 1A-1D illustrate a process for forming a semiconductor device according to one embodiment described herein.

FIGS. 1A-1D illustrate a process for forming a semiconductor device according to one embodiment described herein. FIG. 1A is a perspective view of a semiconductor structure 100. The semiconductor structure 100 may include a substrate 102, a plurality of semiconductor fins 103 (only two are shown), a dielectric material 106 disposed between the semiconductor fins 103 on the substrate 102, and a gate electrode 108 disposed on the dielectric material 106 and over a portion of each semiconductor fin 103. The substrate 102 may be a bulk silicon substrate, and may be doped with a p-type or an n-type impurity. Other substrate materials include, but are not limited to, germanium, silicon-germanium, and group III/V compound semiconductors, such as GaAs, InGaAs, and other similar materials. The semiconductor fins 103 may include the same material as the substrate 102. The dielectric material 106 may form isolation regions, such as shallow trench isolation (STI) regions, and may include SiO, SiN, SiCN, or any suitable dielectric material. A gate spacer 112 may be formed on each side 110 of the gate electrode 108.

Figure 1B:
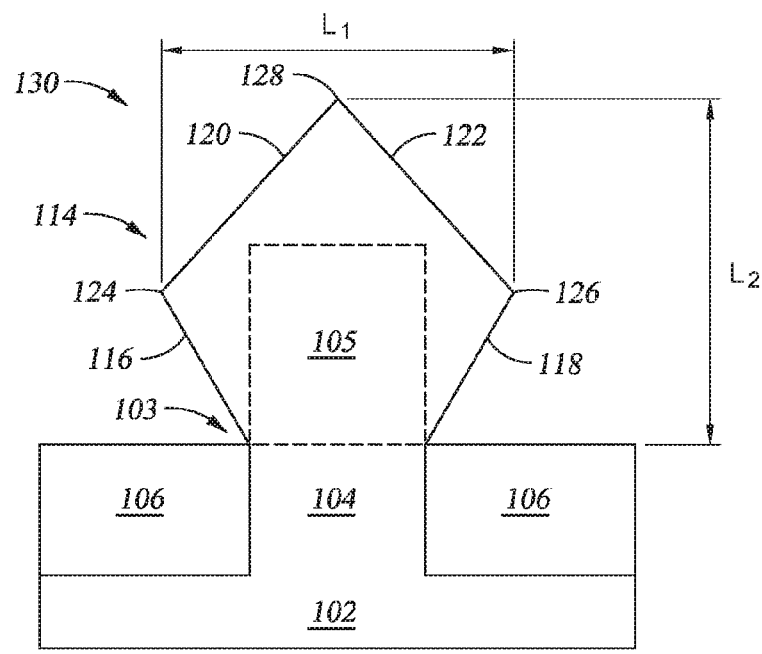

Each semiconductor fin 103 may include a first portion 104 which has a surface 107 that is coplanar with a surface 109 of the dielectric material 106, and a second portion 105 that protrudes from the first portion 104. The second portion 105 may be a source or drain region. To improve transistor performance, a stressor material may be grown in the source/drain region. FIG. 1B shows an epitaxial film 114 disposed over each semiconductor fin 103. The epitaxial film 114 may enclose the second portion 105 of the semiconductor fin 103. Alternatively, the second portion 105 of the semiconductor fin 103 is removed and the epitaxial film 114 is formed on the first portion 104 of the semiconductor fin 103. The removal of the second portion 105 may be achieved by etching, polishing or other suitable removal process. The epitaxial film 114 may include SiGe, SiGe:B, Si:P, Ge:P, or other suitable semiconductor material. In one embodiment, the epitaxial film 114 is an nMOS and includes Si:P. The epitaxial film 114 may be formed using a selective deposition process, such that the epitaxial film 114 is grown on the semiconductor fins 103 and not on the dielectric material 106. The selective deposition process may be achieved by co-flowing an etchant along with the precursor gases into the deposition chamber. Examples of the etchant may be HCl, $Cl_2$, or any suitable halogen gas. Precursor gases may include any suitable silicon containing gas, such as silane, disilane, an organosilane, or a halosilane, phosphorous containing gas such as phosphine, boron containing gas such a borane or diborane, and/or germanium containing gas such a germane.

The epitaxial film 114 may be grown epitaxially on the semiconductor fin 103, and because of the different growth rate on different surface planes, facets may be formed to cause the epitaxial film 114 to have a diamond shape. The epitaxial film 114 may include a plurality of facets 116, 118, 120, 122. Facets 120, 122 may form a top surface 130. Facets 116, 118 may be in contact with the semiconductor fin 103. Facet 116 and facet 120 may be in contact with each other, and a corner 124 may be formed at the contacting point. Facet 118 and facet 122 may be in contact with each other, and a corner 126 may be formed at the contacting point. Facet 120 and facet 122 may be in contact with each other, and a corner 128 may be formed at the contacting point. A lateral distance "L1" between the corner 124 and the corner 126 may be substantially the same as a distance "L2" between the corner 128 and the first portion 104 of the semiconductor fin 103. When a plurality of the epitaxial films 114 are formed adjacent to one another, the corners 124, 126 of one epitaxial film 114 may be merged with the corners 124, 126 of an adjacent epitaxial film 114. In order to improve transistor performance, portions of the epitaxial film 114 may be removed in the lateral dimension, i.e., reducing the lateral distance "L1" without affecting the distance "L2." As a result of a reduced lateral dimension, the distance between adjacent epitaxial films 114 is increased.

Figure 1C:
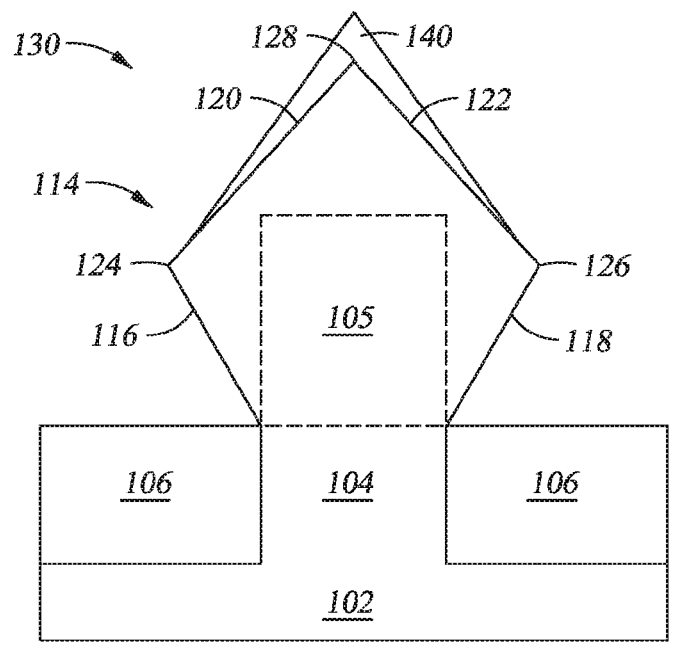
Figure 1D:
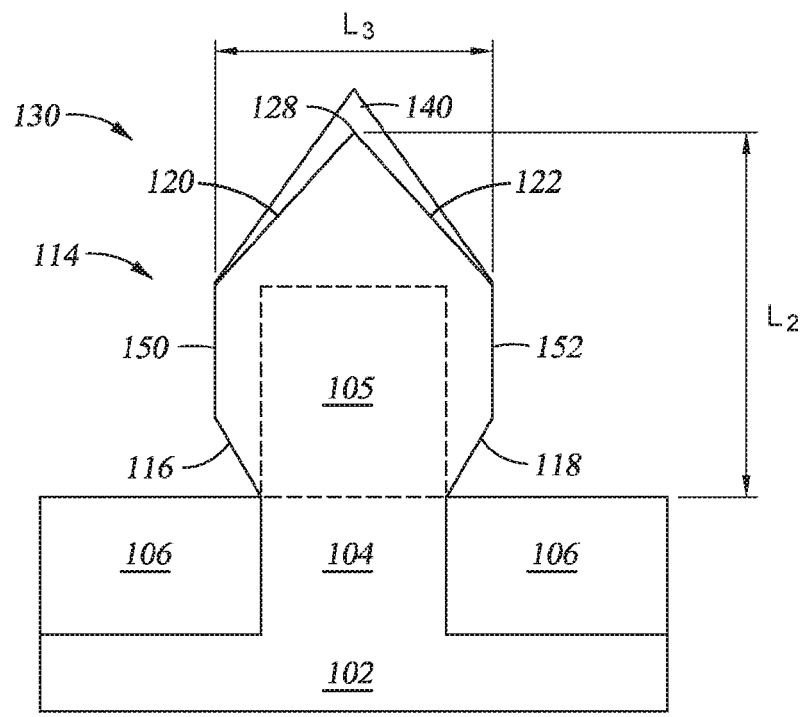

FIGS. 1C and 1D illustrate the process steps of removing portions of the epitaxial film 114. A cap layer 140 may be deposited on the top surface 130 of the epitaxial film 114, as shown in FIG. 1C. The cap layer 140 may be made of a material that has a lower etch rate than the epitaxial film 114 in an etch process. In one embodiment, the epitaxial film 114 is made of Si:P and the cap layer 140 is made of undoped Si. In another embodiment, the epitaxial film 114 is made of SiGe:B and the cap layer 140 is made of SiGe. In another embodiment, the epitaxial film 114 is made of Ge:P and the cap layer 140 is made of SiGe or Si. The cap layer 140 may be deposited in the chamber in which the epitaxial film 114 is formed. In another embodiment, the epitaxial film 114 is made of any suitable epitaxial film, such as SiGe, SiGe:B, Si:P, or Ge:P, and the cap layer 140 is made of $SiO_2$, carbon, or any suitable material that has a slower etch rate than the epitaxial film 114. The cap layer 140 may be deposited with plasma chemistry and an electrical potential bias to provide directional deposition. In that case, the cap layer 140 may be deposited in a different chamber from the chamber in which the epitaxial film 114 is formed. The cap layer 140 may be deposited non-conformally, so the areas of the top surface 130 near corners 124, 126 may not be covered by the cap layer 140, as shown in FIG. 1C. The cap layer 140 may have a maximum thickness at the corner 128, and the thickness of the cap layer 140 may decrease towards the corners 124, 126. The non-conformal deposition of the cap layer 140 may be performed using chemical vapor deposition (CVD). A high order silane such as disilane, trisilane, or tetrasaline, may be used as the precursor gas for the CVD process. The CVD process may be performed at a high chamber pressure to achieve non-conformal deposition, such as between about 100 Torr and about 760 Torr. Lowering the processing temperature may reduce conformality of the cap layer 140. The deposition of the cap layer 140 may be non-selective or selective. In one embodiment, the deposition of the cap layer 140 is selective so deposition of material of the cap layer 140 on the dielectric material 106 is reduced. Selective deposition of the cap layer 140 on the epitaxial film 114 may be achieved by adding an etchant, such as HCl, to the precursor gas.

After the cap layer 140 is deposited on the top surface 130, an etch process may be performed to remove corners 124, 126, as shown in FIG. 1D. The etch process may be performed in the same chamber in which the epitaxial film 114 and the cap layer 140 are formed. Alternatively, the etch process may be performed in a different chamber. A portion of each facet 120, 122, 116, 118 may be removed along with the corners 124, 126, because no cap layer, or a thin portion of the cap layer 140, is covering the removed portions. The thin portions of the cap layer 140 may be also removed. Thus, portions of the epitaxial film 114 are removed in the lateral direction, which is a direction transverse to a major axis of the fin 103. The remaining portion of the epitaxial film 114 may be protected by a relatively thicker portion of the cap layer 140, thus is not removed by the etch process. Two additional facets 150, 152 may be formed as the result of the etch process. The facet 150 contacts the remaining portion of the facet 120 and the remaining portion of the facet 116, and the facet 152 contacts the remaining portion of the facet 122 and the remaining portion of the facet 118. The lateral distance "L3" between the two facets 150, 152 may be about 50 to 70 percent of the distance "L2," which is not affected by the etch process. The facets 150, 152 may be substantially perpendicular to the substrate 102, and the etch process may be a directional bias etch, employing a plasma etching chemistry and an electric potential bias to provide a directional etch. The etchant used for the etch process may include HCl, $Cl_2$, or any halogen etchant that has similar reactivity with the epitaxial film 114 and the cap layer 140. The etch process may also include using Ar or other suitable ions for physical sputtering with directional bias to remove the thin portions of the cap layer 140 and the epitaxial film 114 near the corners 124,126, and the facets 150,152 are formed after the etch process. The reduced lateral distance "L3" ensures a gap is formed between adjacent epitaxial films.

Figure 2A:
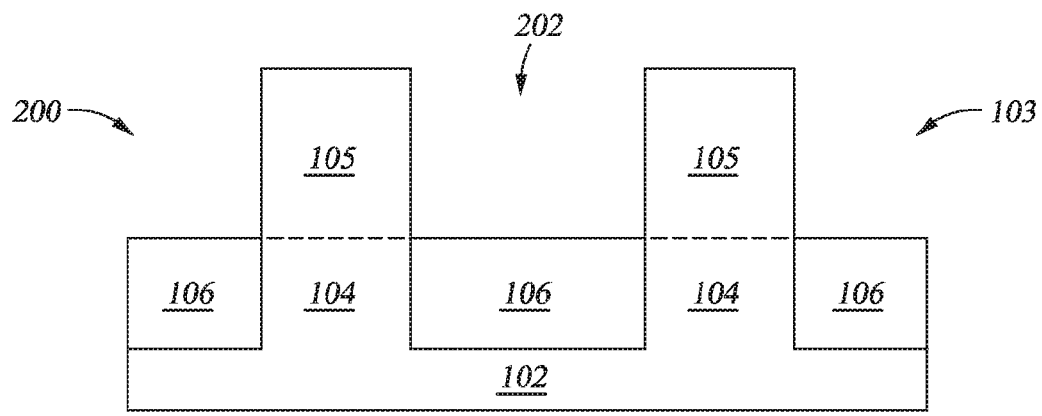
FIGS. 2A-2C illustrate a process for forming the semiconductor device according to another embodiment described herein.
Figure 2B:
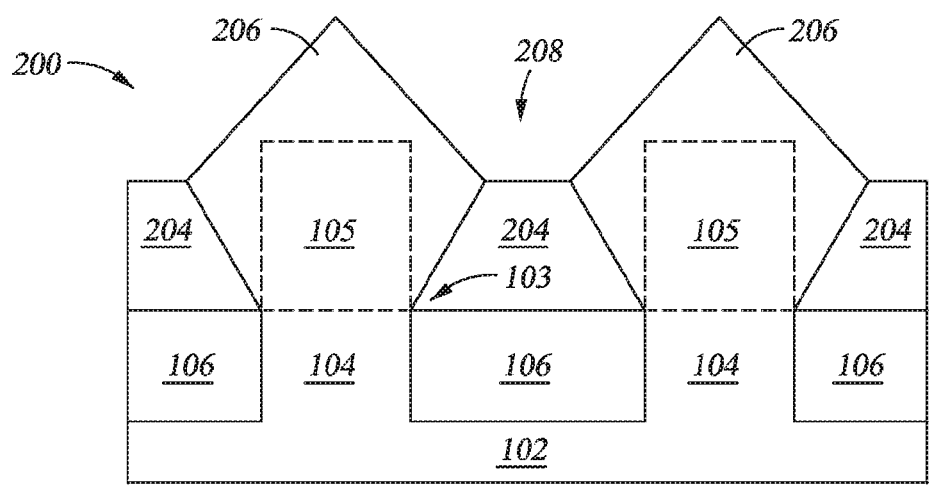
Figure 2C:
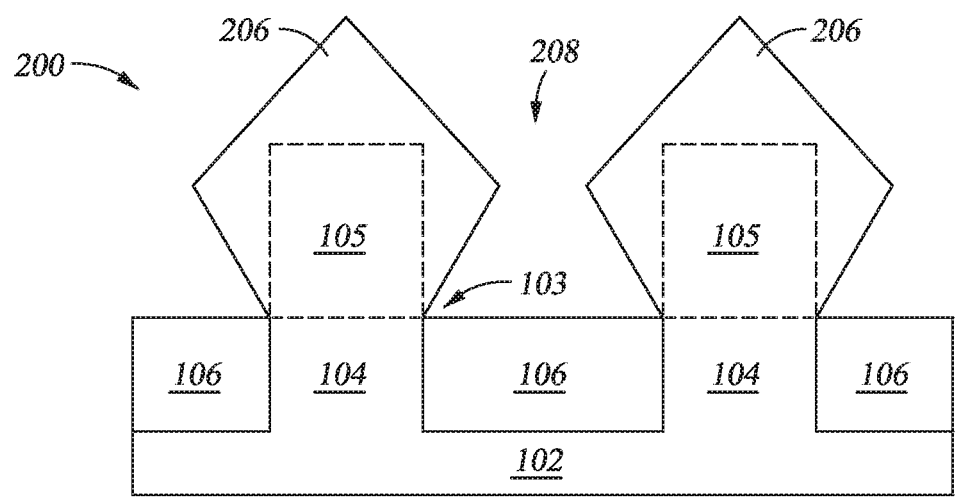

FIGS. 2A-2C illustrate a process for forming the semiconductor device according to another embodiment described herein. FIG. 2A shows a semiconductor structure 200 including the substrate 102, a plurality of semiconductor fins 103 (only two are shown), and the dielectric material 106. The semiconductor fin 103 may include the first portion 104 and the second portion 105 that protrudes from the first portion 104. The second portion 105 may not be present. In one embodiment, the second portion 105 may be removed. The semiconductor structure 200 may include a top surface 202 having one or more semiconductor regions, such as the second portion 105 or the first portion 104 of the semiconductor fins 103, and one or more dielectric regions, such as the dielectric material 106.

The substrate 102 having the top surface 202 may be placed in a deposition chamber, where a non-selective deposition of a semiconductor material is performed on the top surface 202. The resulting material is an amorphous semiconductor material 204 deposited on the dielectric material 106 and an epitaxial film 206 having crystalline structure deposited on the semiconductor fins 103. The amorphous semiconductor material 204 and the epitaxial film 206 may be deposited concurrently. The epitaxial film 206 may have the same shape as the epitaxial film 114. The non-selective deposition of the amorphous semiconductor material 204 and the epitaxial film 206 may be achieved by flowing a semiconductor precursor gas and/or a dopant gas without an etchant gas. The precursor gases may be flowed into the deposition chamber and may include any suitable silicon containing gas, phosphorous containing gas, boron containing gas, and/or germanium containing gas. In one embodiment, the amorphous semiconductor material 204 and the epitaxial film 206 both includes SiGe, SiGe:B, Si:P, Ge:P, or other suitable semiconductor material.

During the non-selective deposition, the amorphous semiconductor material 204 between adjacent epitaxial films 206 prevents the adjacent epitaxial films 206 from growing in lateral direction and approaching each other, so that a gap 208 forms between adjacent epitaxial films 206. The amount of amorphous semiconductor material 204 deposited on the dielectric material 106 may be controlled by adjusting the chamber pressure and temperature during the non-selective deposition. Increasing the chamber pressure and/or reducing the chamber temperature may cause more amorphous semiconductor material 204 to be deposited on the dielectric material 106.

After the non-selective deposition, from which the amorphous semiconductor material 204 may be deposited on the dielectric material 106 and epitaxial films 206 may be grown on the semiconductor fins 103, the amorphous semiconductor material 204 may be removed, as shown in FIG. 2C. The removal of the amorphous semiconductor material 204 may be achieved by an etch process, such as the etch process used for removing portions of the epitaxial film 114 in the lateral direction. The etch process may be performed in the same deposition chamber in which the non-selective deposition is performed, or in a different chamber. Even though there is no cap layer disposed on the epitaxial films 206 in FIG. 2C to protect the epitaxial films 206 from the etch process, the amorphous semiconductor material 204 may be completely removed by the etch process before any substantial amount of epitaxial films 206 is removed, due to the difference in etch rate between the amorphous semiconductor material 204 and the crystalline epitaxial films 206. The crystalline structure of the epitaxial films 206 has a much slower etch rate compared to the amorphous semiconductor material 204.

A cap layer, such as the cap layer 140, may be deposited on the epitaxial films 206 to protect the epitaxial film 206 prior to removing the amorphous semiconductor material 204. Again the cap layer may have a slower etch rate than the epitaxial film 206. The cap layer may be selectively deposited on the epitaxial film 206 but not on the amorphous semiconductor material 204. The cap layer may be deposited in the same deposition chamber in which the non-selective deposition is performed.

While the foregoing is directed to embodiments of the disclosure, other and further embodiments may be devised without departing from the basic scope thereof, and the scope thereof is determined by the claims that follow.

The invention claimed is:

1. A method for forming a semiconductor device, comprising:
    forming an epitaxial film over a semiconductor fin, wherein the epitaxial film includes a top surface, a first corner, and a second corner opposite the first corner;
    depositing a cap layer non-conformally on the top surface; and
    removing the first and second corners of the epitaxial film.

2. The method of claim 1, wherein the top surface of the epitaxial film includes a first facet and a second facet, wherein the epitaxial film further comprises a third facet contacting the first facet and the semiconductor fin and a fourth facet contacting the second facet and the semiconductor fin.

3. The method of claim 2, wherein the first facet and the third facet form the first corner, and the second facet and the fourth facet form the second corner.

4. The method of claim 3, wherein removing the first and second corners of the epitaxial film comprises removing a portion of the first, second, third, and fourth facets.

5. The method of claim 3, wherein the removing the first and second corners of the epitaxial film forms a fifth facet contacting a remaining portion of the first facet and a remaining portion of the third facet and a sixth facet contacting a remaining portion of the second facet and a remaining portion of the fourth facet.

6. The method of claim 1, wherein the forming the epitaxial film, depositing the cap layer, and removing the first and second corners of the epitaxial film are performed in a same process chamber.

7. A method for forming a semiconductor device, comprising:
   forming an epitaxial film over a semiconductor fin;
   depositing a cap layer on the epitaxial film; and
   removing portions of the epitaxial film in a lateral direction, wherein the epitaxial film has a first etch rate in an etch process and the cap layer has a second etch rate in the etch process, wherein the second etch rate is slower than the first etch rate.

8. The method of claim 7, wherein the epitaxial film comprises a top surface including a first facet and a second facet, wherein the epitaxial film further comprises a third facet contacting the first facet and the semiconductor fin and a fourth facet contacting the second facet and the semiconductor fin.

9. The method of claim 8, wherein the first facet and the third facet form a first corner, and the second facet and the fourth facet form a second corner opposite the first corner.

10. The method of claim 9, wherein removing portions of the epitaxial film comprises removing the first and second corners of the epitaxial film.

11. The method of claim 10, wherein removing the first and second corners of the epitaxial film comprises removing a portion of the first, second, third, and fourth facets.

12. The method of claim 10, wherein the removing the first and second corners of the epitaxial film forms a fifth facet contacting a remaining portion of the first facet and a remaining portion of the third facet and a sixth facet contacting a remaining portion of the second facet and a remaining portion of the fourth facet.

13. The method of claim 7, wherein the forming the epitaxial film, depositing the cap layer, and removing portions of the epitaxial film are performed in a same process chamber.

14. A method for forming a semiconductor device, comprising:
   disposing a substrate in a process chamber, the substrate having a surface including one or more dielectric regions adjacent to one or more semiconductor fins;
   performing a non-selective deposition of a semiconductor material on the surface, wherein a first portion of the semiconductor material is deposited on the semiconductor fins and a second portion of the semiconductor material is deposited on the dielectric regions; and
   selectively removing the second portion to form gaps separating areas of the first portion.

15. The method of claim 14, further comprising depositing a cap layer on the first portion of the semiconductor material before selectively removing the second portion of the semiconductor material.

16. The method of claim 15, wherein the cap layer is deposited non-conformally on the first portion of the semiconductor material.

17. The method of claim 16, wherein the second portion of the semiconductor material is an amorphous semiconductor material and the first portion of the semiconductor material is an epitaxial film having a crystalline structure.

18. The method of claim 17, wherein the epitaxial film has a first etch rate in an etch process and the cap layer has a second etch rate in the etch process, wherein the second etch rate is slower than the first etch rate.

19. The method of claim 18, wherein the performing a non-selective deposition, the depositing of a cap layer, and the selectively removing the second portion of the semiconductor material are performed in the process chamber.

20. The method of claim 14, wherein the performing a non-selective deposition and the selectively removing the second portion of the semiconductor material are performed in the process chamber.

* * * * *